US012672342B2

(12) United States Patent
Lee et al.

(10) Patent No.: US 12,672,342 B2
(45) Date of Patent: Jun. 30, 2026

(54) INTEGRATED BOOT DIODE WITH HIGH FORWARD BIAS CAPABILITY

(71) Applicant: Texas Instruments Incorporated, Dallas, TX (US)

(72) Inventors: Dong Seup Lee, McKinney, TX (US); Sunglyong Kim, Allen, TX (US); Kyoung Min Lee, Cary, NC (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 384 days.

(21) Appl. No.: 18/325,376

(22) Filed: May 30, 2023

(65) Prior Publication Data

US 2024/0405017 A1    Dec. 5, 2024

(51) Int. Cl.
H10D 84/80        (2025.01)
H10D 30/01        (2025.01)

(52) U.S. Cl.
CPC ....... H10D 84/811 (2025.01); H10D 30/0281 (2025.01)

(58) Field of Classification Search
CPC ............. H10D 84/811; H10D 30/0281; H10D 30/603; H10D 30/0221
See application file for complete search history.

(56) References Cited

U.S. PATENT DOCUMENTS

2022/0149186 A1*    5/2022    Edwards ............ H10D 30/0285

* cited by examiner

*Primary Examiner* — Mohammad A Rahman
(74) *Attorney, Agent, or Firm* — Xiaotun Qiu; Frank D. Cimino

(57)        ABSTRACT

A microelectronic device including an integrated boot diode and a depleted mode LDMOS transistor with a charge balance layer isolated from the body region and electrically in contact with a substrate. The connection of the charge balance layer of the depleted mode LDMOS transistor directly to the substrate or ground reference eliminates body diode turn-on from the body of the transistor to the drain which typically happens above approximately 0.7 volts. In addition, the depleted mode LDMOS transistor may separate a source contact from a body contact which allows a negative bias of the body with respect to the source. Typically, the source voltage is limited to approximately 7 volts before parasitic PNP turn on becomes a factor. By negatively biasing the body with respect to the source, the maximum source voltage of the depleted mode LDMOS transistor without PNP parasitic turn-on may be increased to approximately 30 V.

10 Claims, 21 Drawing Sheets

100

101

SUPPRESSION OF BODY TURN-ON
WITH CHARGE BALANCE LAYER
CONNECTED TO GROUND REFERENCE

IMPROVEMENT IN SOURCE VOLTAGE
WITH NEGATIVE BODY VOLTAGE $I_S$ (ARBITRARY UNITS)

$V_S$ (ARBITRARY UNITS)

BIAS VOLTAGE=-5V
BIAS VOLTAGE=0
BIAS VOLTAGE=-3V

INTEGRATED BOOT DIODE WITH HIGH FORWARD BIAS CAPABILITY

TECHNICAL FIELD

This disclosure relates to the field of microelectronic devices. More particularly, but not exclusively, this disclosure relates to semiconductor components having an integrated boot diode with high forward bias capability.

BACKGROUND

Semiconductor components are being continually improved to operate with smaller feature sizes and higher levels of integration. Fabricating semiconductor boot diodes with higher levels of integration is challenging.

SUMMARY

This summary is provided to introduce a brief selection of disclosed concepts in a simplified form that are further described below in the detailed description including the drawings provided. This summary is not intended to limit the claimed subject matter's scope.

Disclosed examples include a microelectronic device including a boot diode with an integrated depleted mode LDMOS transistor with a charge balance layer which is electrically in contact with a substrate. The connection of the charge balance layer of the depleted mode LDMOS transistor directly to the substrate or ground reference eliminates body diode turn-on from the body of the transistor to the drain which typically happens above approximately 0.7 volts. In addition, the depleted LDMOS transistor may separate a source contact from a body contact which allows a negative bias of the body region with respect to the source. Without negatively biasing the body, the source voltage is limited to approximately 7 volts before parasitic PNP turn-on becomes a factor. By negatively biasing the body with respect to the source, the maximum source voltage of the depleted mode LDMOS transistor without PNP parasitic turn-on may be increased to approximately 30 V.

DETAILED DESCRIPTION

Figure 1A:
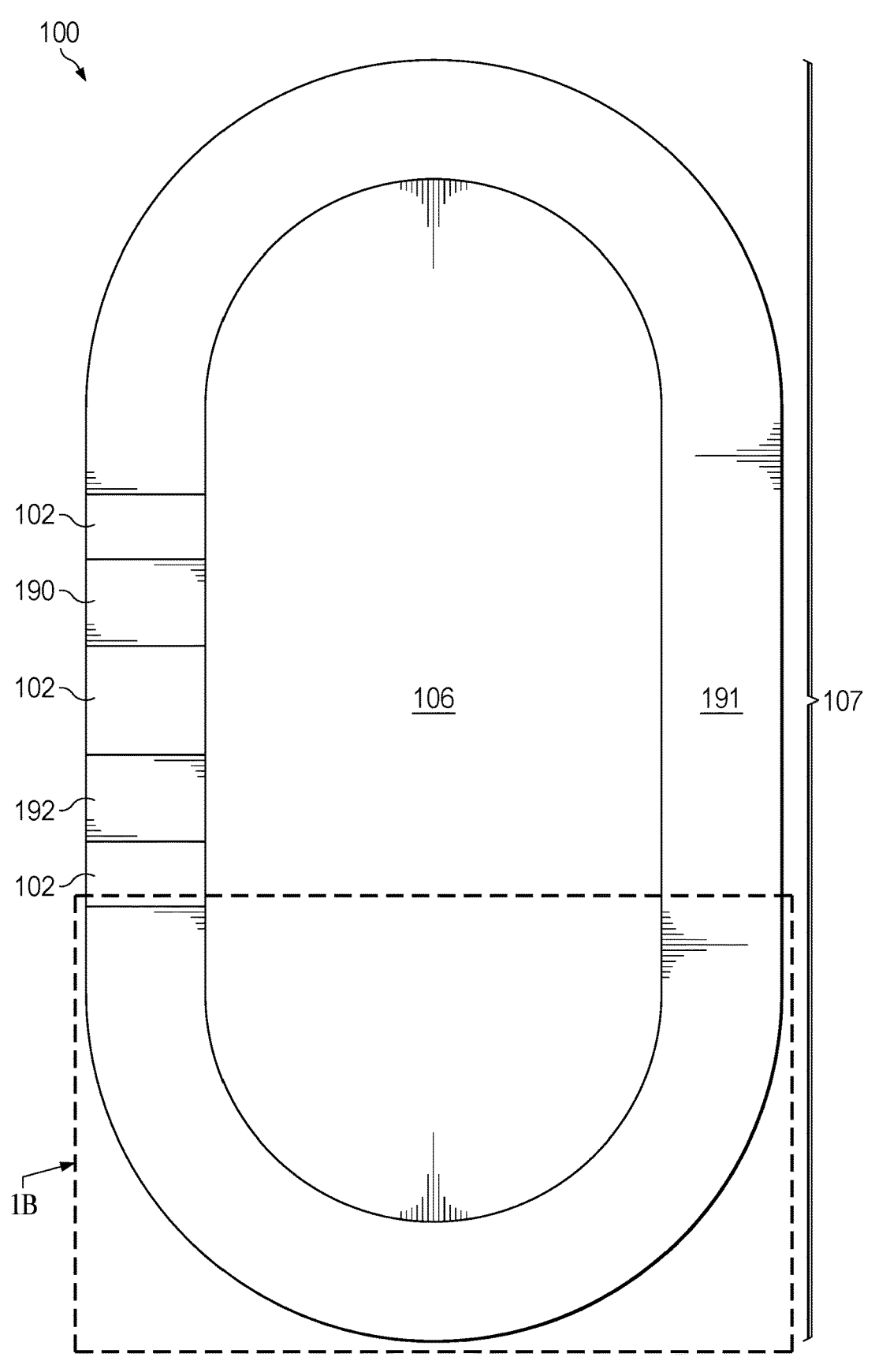
FIG. 1A shows a top-down view of a circuit containing a boot diode and junction diode surrounding a high voltage tank.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

In addition, although some of the embodiments illustrated herein are shown in two dimensional views with various regions having depth and width, it should be clearly understood that these regions are illustrations of only a portion of a device that is actually a three-dimensional structure. Accordingly, these regions will have three dimensions, including length, width, and depth, when fabricated on an actual device. Moreover, while the present disclosure is illustrated by embodiments directed to active devices, it is not intended that these illustrations be a limitation on the scope or applicability of the present disclosure. It is not intended that the active devices of the present disclosure be limited to the physical structures illustrated. These structures are included to demonstrate the utility and application of the present disclosure to presently preferred embodiments.

It is noted that terms such as top, bottom, over, above, and under may be used in this disclosure. These terms should not be construed as limiting the position or orientation of a structure or element, but should be used to provide spatial relationship between structures or elements. The terms "lateral" and "laterally" refer to directions parallel to a plane corresponding to a surface of a layer, for example a top surface of a channel layer.

Drain extended transistors can include drain-extended NMOS (DENMOS), drain-extended PMOS (DEPMOS), and/or laterally diffused MOS (LDMOS) transistors, as well as groups of DENMOS and DEPMOS, referred to as complimentary drain extended MOS or DECMOS transistors. Described examples include doped regions of various semiconductor structures which may be characterized as p-doped and/or n-doped regions or portions, and include regions that have majority carrier dopants of a particular type, such as n-type dopants or p-type dopants. For the purposes of this specification, doping of the first type may be p-type doping and doping of the second type may be n-type doping.

Semiconductor components are being continually improved to operate with smaller feature sizes. Fabricating semiconductor components with LDMOS transistor which meet area scaling, performance requirements, and reliability requirements is challenging. For LDMOS transistors in high voltage applications such as boot diodes and junction diodes, transistor parameters such as body diode turn on and maximum source voltage may limit high voltage applications. To eliminate body diode turn on for a depleted mode LDMOS transistor and support higher source voltages, the disclosure includes a depleted mode LDMOS transistor with a charge balance layer which is electrically in contact with a ground reference. The connection of the charge balance layer eliminates body diode turn to from the body of the transistor to the drain which typically happens above approximately 0.7 volts. In addition, the disclosed depleted LDMOS transistor separates a source contact from a body contact which allows a negative bias of the body with respect to the source. Without negatively biasing the body, the source voltage is limited to approximately 7 volts before parasitic PNP turn on becomes a factor. By negatively biasing the body with respect to the source, the maximum source voltage without PNP parasitic turn-on can be increased to approximately 30 V.

FIG. 1A is a top-down figure of a microelectronic device 100 including a high voltage circuit 106, surrounded by a high voltage isolation circuit 107 which includes an integrated boot diode 191 consisting of a depleted mode LDMOS transistor 101 (discussed in FIGS. 1D-1E) herein referred to as the LDMOS transistor 101. It is advantageous to integrate the boot diode 191 as a component of the high voltage isolation circuit 107 compared to a boot diode as an off-chip component. Integration of the LDMOS transistor 101 as an integrated boot diode 191 reduces cost by providing area entitlement. Junction diodes 102 and level shifters 192 complete the high voltage isolation circuit 107 surrounding the high voltage circuit 106. A clamp diode (not shown) is placed in series with the LDMOS transistor 101 of the integrated boot diode 191.

Figure 1B:
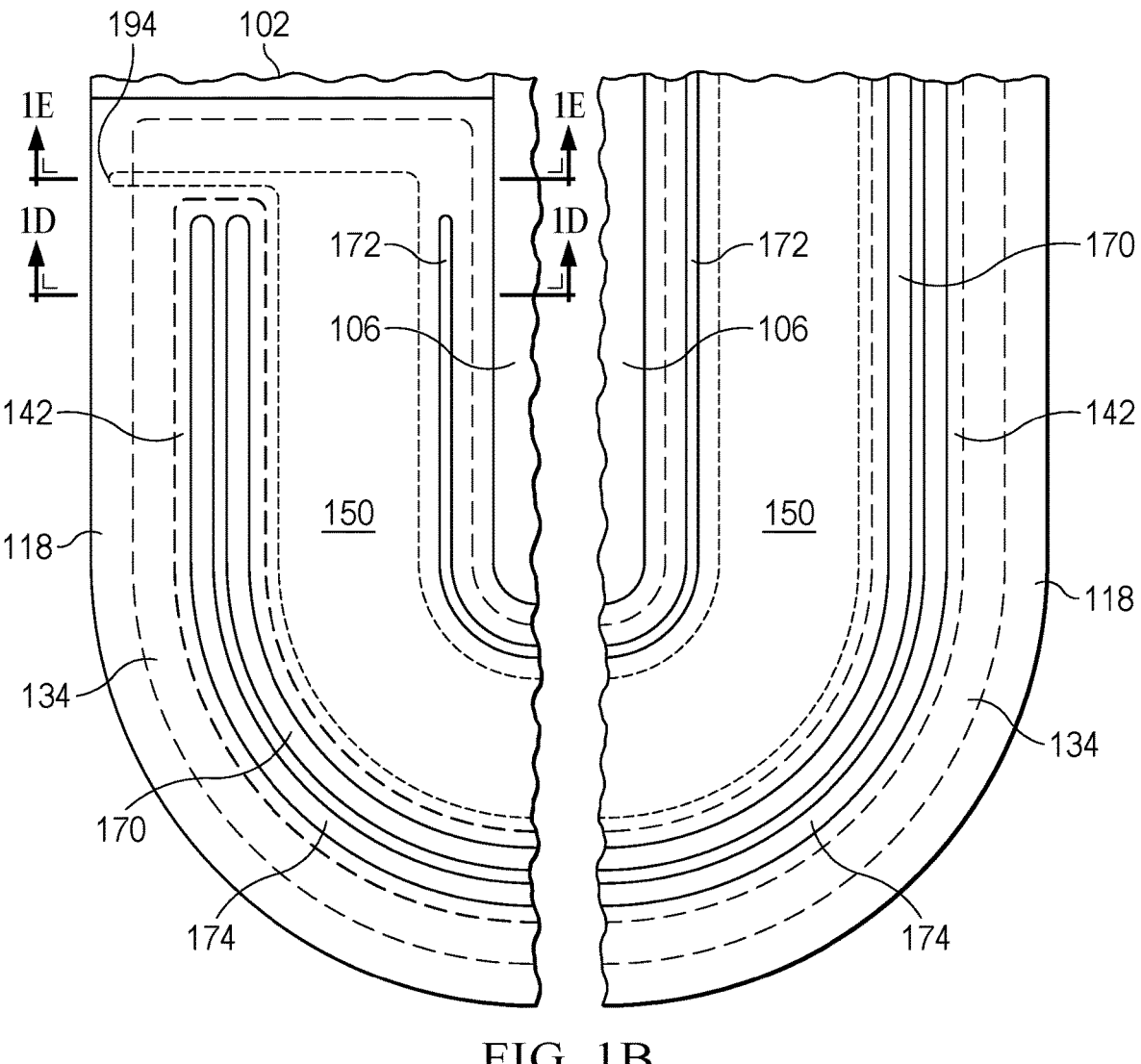
FIG. 1B is a top-down view of selected layers of an example LDMOS transistor in an integrated boot diode showing a charge balance layer connection to a ground reference (epitaxial silicon) outside the LDMOS transistor

FIG. 1B shows a top-down view of a microelectronic device 100 including an LDMOS transistor 101 (discussed in FIGS. 1D-1E) which shows several implant layers of the disclosed invention. Other layers are omitted for clarity. A key inventive aspect of the disclosure is the isolation of the charge balance layer 150 from the p-type dwell region 142, and the addition of a charge balance layer connection 194 which forms an electrical connection between the charge balance layer 150 and the epitaxial layer 118, which is a ground reference. The charge balance layer connection 194 is located between the source region 170 and a junction diode 102 of a high voltage isolation circuit 107. Any ground reference, such as a bond pad for example, could also be used to isolate the charge balance layer 150 from the p-type dwell region 142. FIG. 1B also shows a portion of a high voltage circuit 106, and the drain region 172 of the LDMOS transistor 101.

Figure 1C:
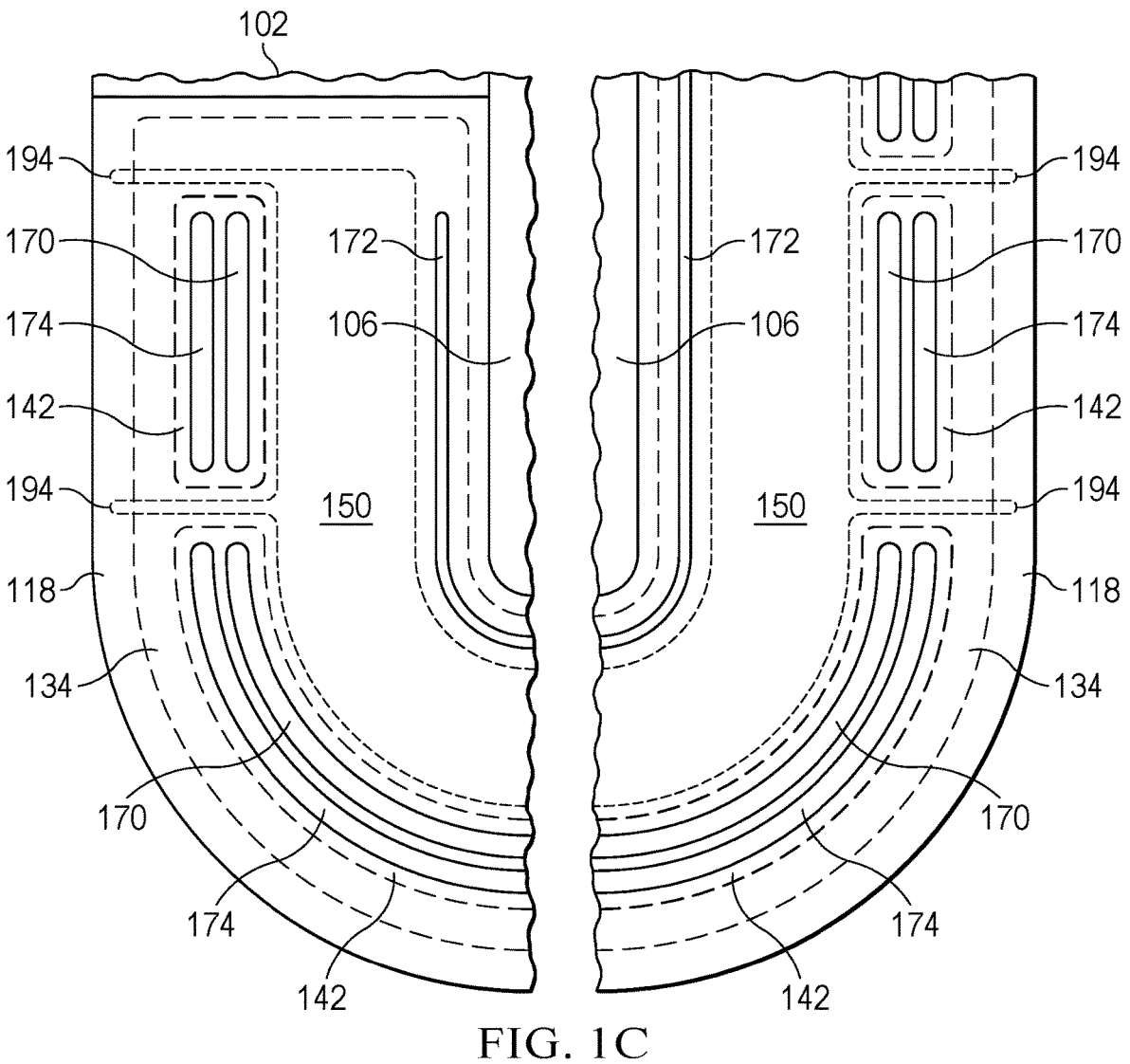
FIG. 1C is a top-down view of selected layer of an example LDMOS transistor in an integrated boot diode showing a plurality of charge balance layer connections to a ground reference (epitaxial silicon) outside the LDMOS transistor.

FIG. 1C shows an alternate embodiment of a microelectronic device 100 including an LDMOS transistor 101 (discussed in FIGS. 1D-1E) showing several implant layers of the disclosed invention. Other layers are omitted for clarity. Unlike FIG. 1B which contains a single charge balance layer connection 194, between the charge balance layer 150 and the epitaxial layer 118, FIG. 1C shows an embodiment with multiple charge balance layer connections 194 between the charge balance layer 150 and the epitaxial layer 118. In FIG. 1C, the location of the charge balance layer connection may be between located between the source region 170 and a junction diode 102 of a high voltage isolation circuit 107, or the charge balance layer connections 194 may be between segments of the source region 170 when the source region 170 is not continuous. Multiple charge balance layer connections 194 may be advantageous for the LDMOS transistor 101 depending on the particular configuration. FIG. 1C also shows a portion of a high voltage circuit 106, and the drain region 172 of the LDMOS transistor 101.

Figure 1D:
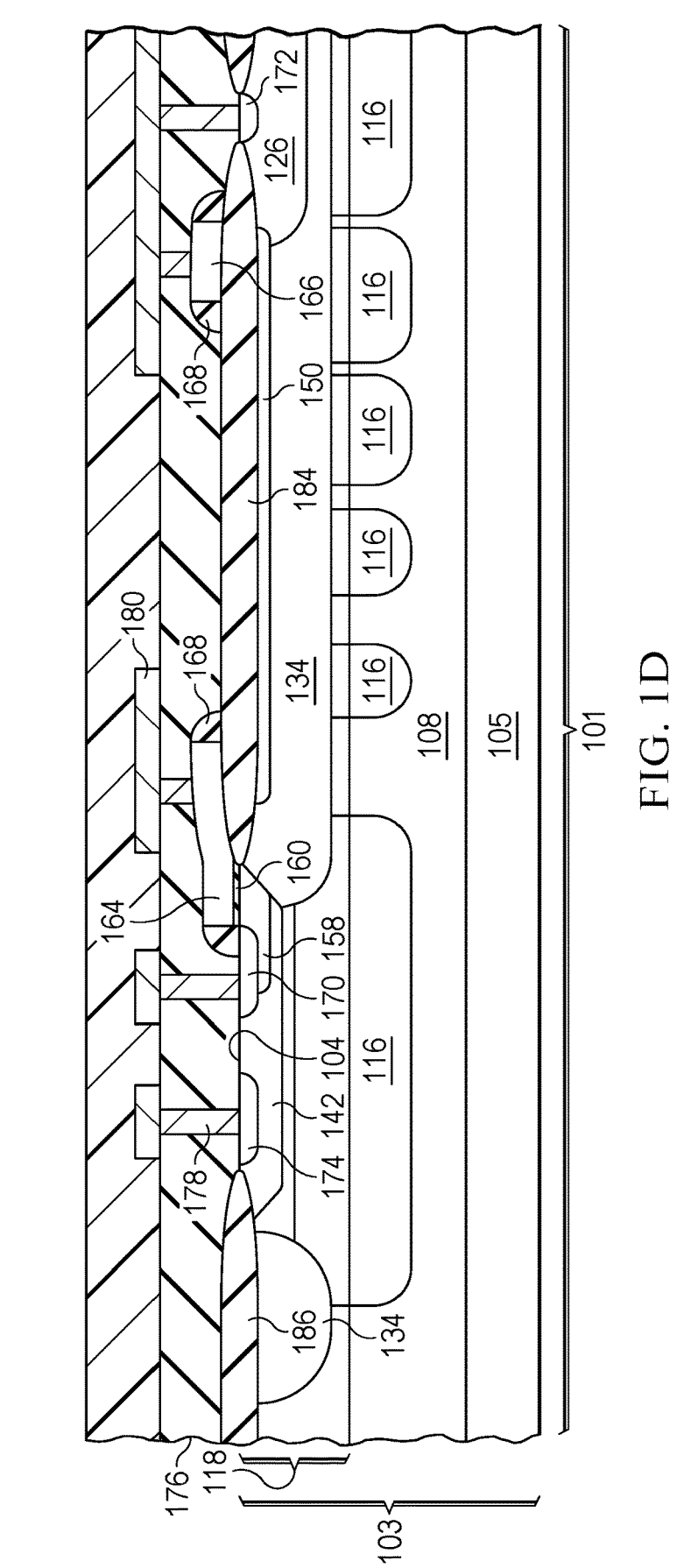
FIG. 1D is a cross section through the example LDMOS transistor of FIG. 1B.

Referring to FIG. 1D, a cross section through the LDMOS transistor 101 of FIG. 1B is shown. Details of the method of formation and components not referenced in FIG. 1D are given in the discussion in FIG. 2A-FIG. 2L. The LDMOS transistor 101 is on a base wafer 105 that has a silicon semiconductor material 108. The silicon semiconductor material 108 may include an epitaxial layer 118 of silicon. The epitaxial layer 118, silicon semiconductor material 108, and the base wafer 105 form the substrate 103. The p-type dwell region 142 may serve as a p-type body region of the LDMOS transistor 101, and sometimes may be referred to for convenience or clarity as the body region. The NBDRIFT region 116 and a high voltage nwell region 134, serve as the drain drift region, and have a second conductivity type opposite the first conductivity type. In the region shown in FIG. 2B, which is in the LDMOS transistor 101, the charge balance region is electrically isolated from the source region 170 and the p-type dwell region 142 (the body region).

Figure 1E:
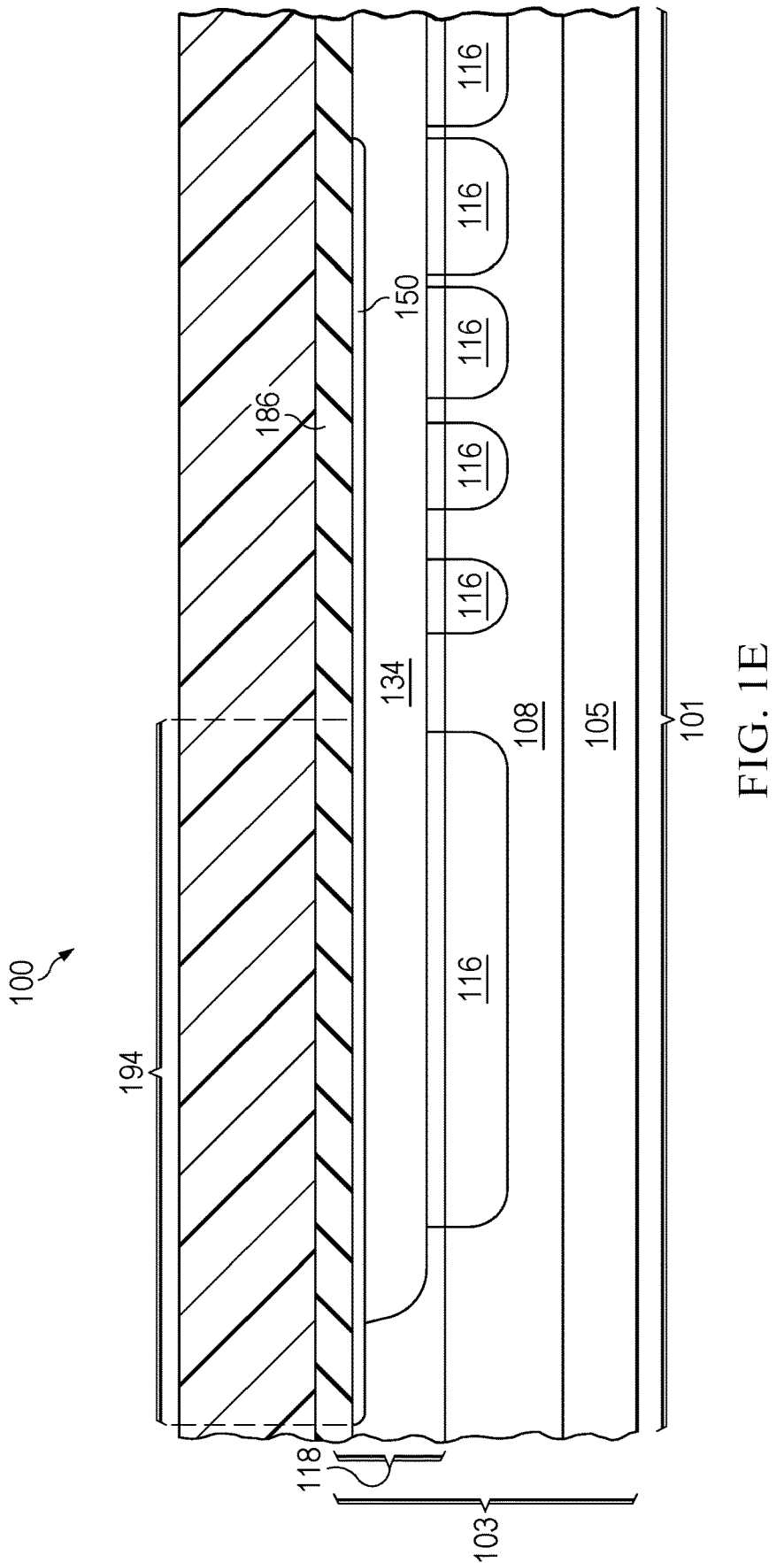
FIG. 1E is a cross section outside the example LDMOS transistor of FIG. 1B showing the charge balance layer contacting a ground reference outside the LDMOS transistor.

Referring to FIG. 1E, a cross section through a region outside of the LDMOS transistor 101 of FIG. 1B is shown. Details of the method of formation and components not referenced in FIG. 1E are given in the discussion in FIG. 2A-FIG. 2L. The cross section in FIG. 1E shows the charge balance layer 150 in the region outside of the LDMOS transistor 101 where the charge balance layer 150 runs over the high voltage nwell region 134 and electrically is in contact with the epitaxial layer 118 through the charge balance layer connection 194 providing a ground reference for the charge balance layer 150 and isolation of the charge balance layer 150 from the p-type dwell region 142 (out of the plane of FIG. 1E).

Figure 2A:
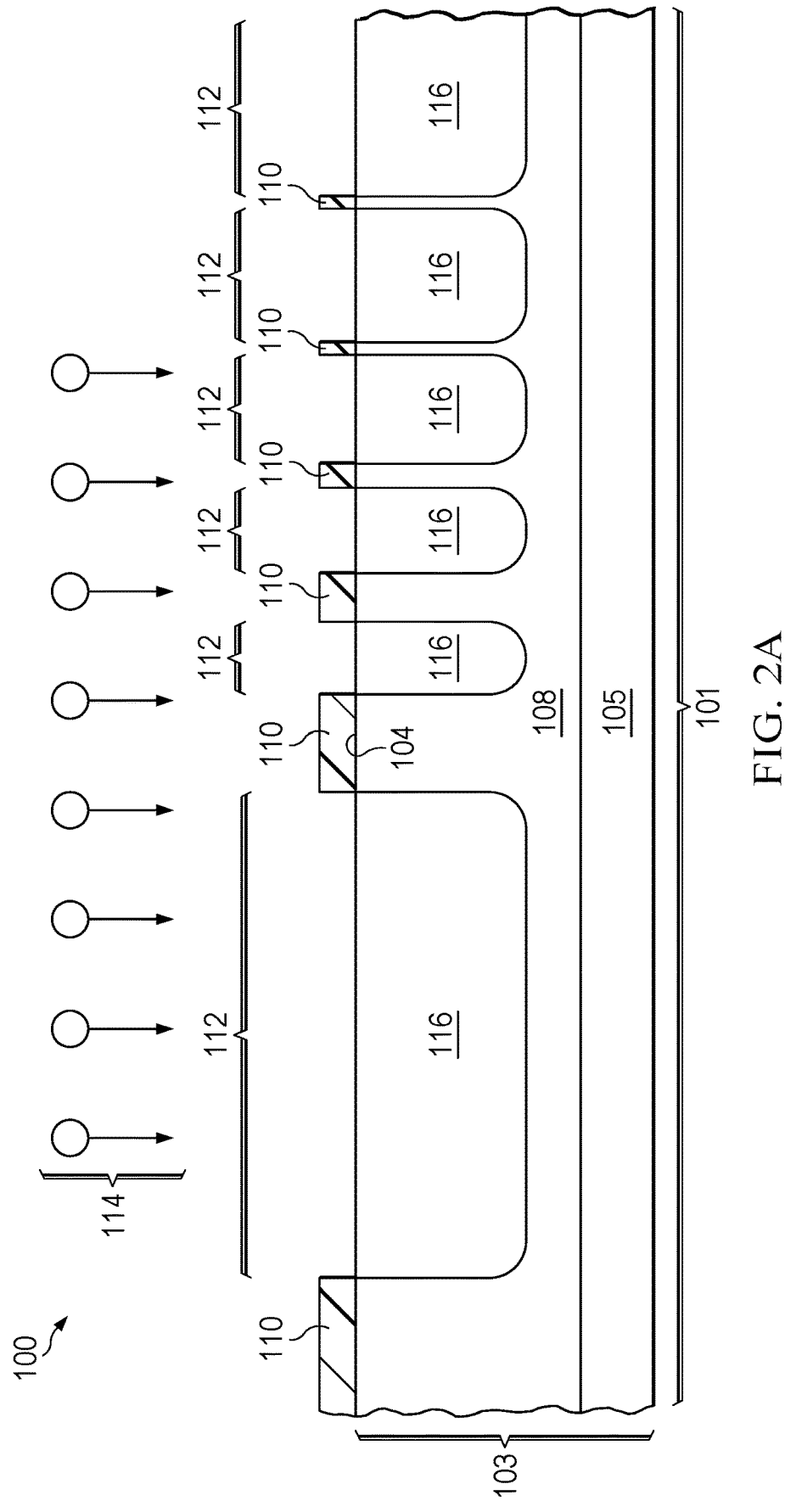
FIG. 2A-FIG. 2L are cross sections of an example LDMOS transistor in various stages of formation.

FIG. 2A-FIG. 2L are cross sectional diagrams of progressive processing steps for an example method of forming the LDMOS transistor 101 shown in the cross section discussed in FIG. 1D. FIG. 2A shows the LDMOS transistor 101 at the point in the process flow after a NBDRIFT photoresist 110 has been patterned with NBDRIFT resist openings 112. The NBDRIFT resist openings are positioned to provide an increasing dopant concentration towards the drain region 172 (shown in FIG. 2K) of the LDMOS transistor 101. The NBDRIFT implant 114 species may be phosphorus, and may have a dose between $1\times10^{12}$ cm$^{-2}$ to $1\times10^{13}$ cm$^{-2}$, implanted with an energy between 30 keV and 300 keV. After the NBDRIFT implant 114, the NBDRIFT photoresist 110 may be removed and the wafer cleaned (not shown).

Figure 2B:
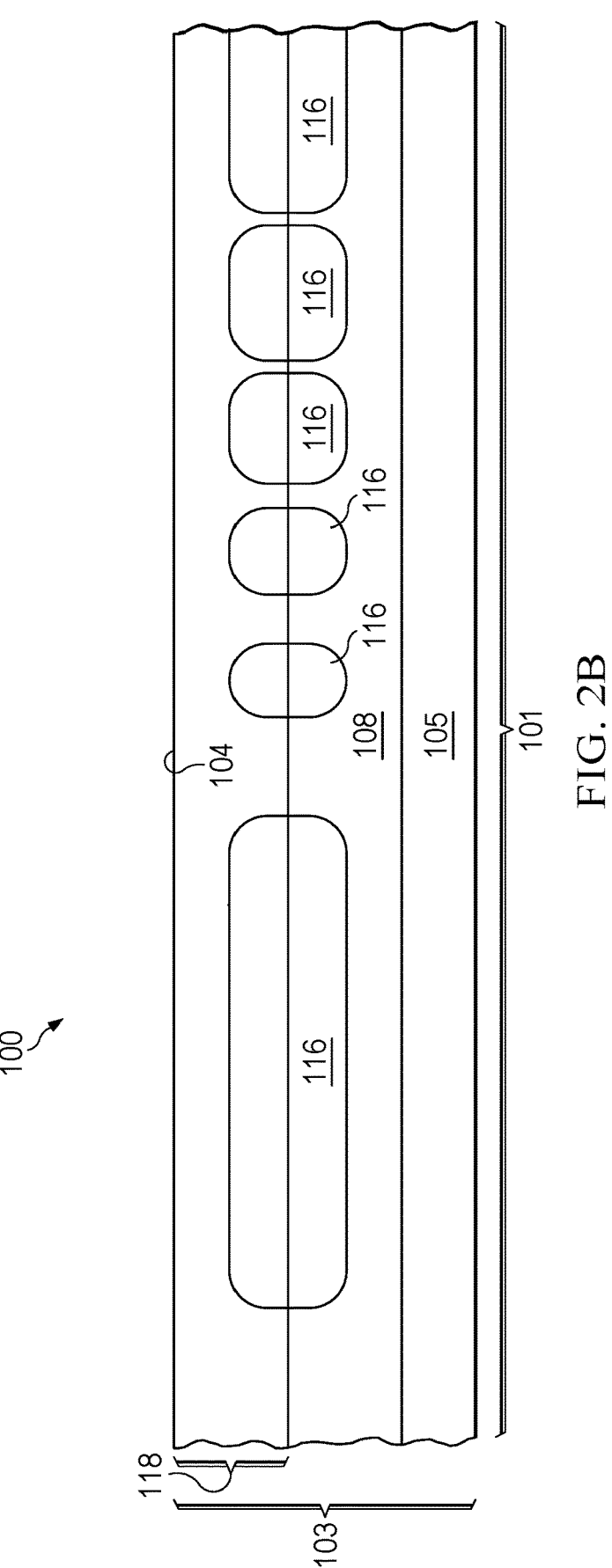

FIG. 2B shows the LDMOS transistor 101 at the point in the process flow after an epitaxial layer 118 has been grown on silicon semiconductor material 108. The silicon semiconductor material 108 may be p-type with a dopant concentration of $1\times10^{17}$ atoms/cm$^3$ to $1\times10^{18}$ atoms/cm$^3$, for example. Alternatively, the silicon semiconductor material 108 may be lightly doped, with an average dopant concentration below $1\times10^{16}$. The epitaxial layer 118 is a lightly doped p-type layer and may have a typical boron concentration of $7\times10^{14}$ cm$^{-3}$ to $1.4\times10^{16}$ cm$^{-3}$. A furnace drive step results in diffusion of the NBDRIFT region 116 into the into the epitaxial layer 118.

Figure 2C:
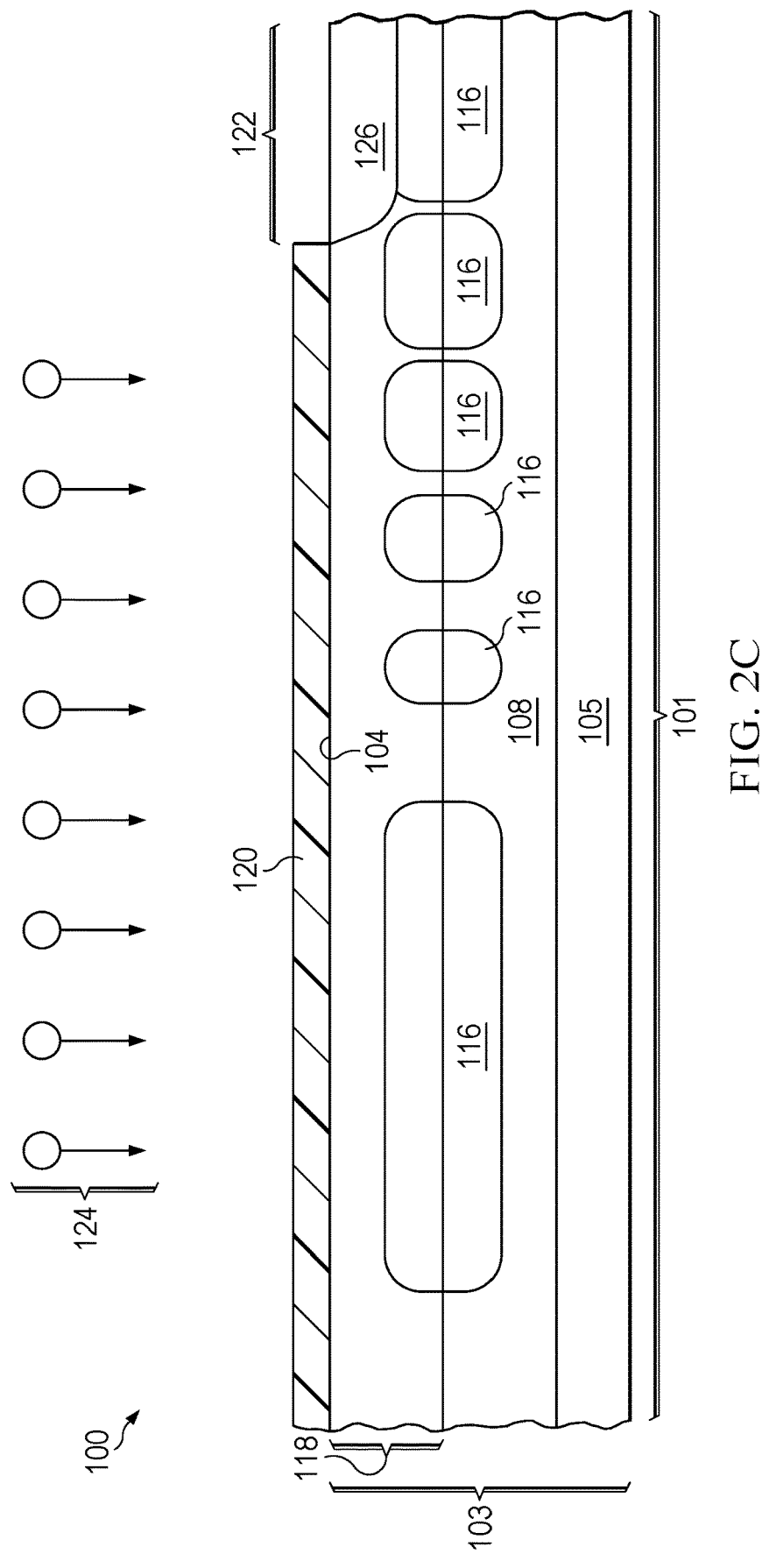

FIG. 2C shows the LDMOS transistor 101 at the point in the process flow during the formation of the nwell 126 region. A nwell photoresist 120 is patterned and a nwell resist opening 122 is formed. The nwell implant 124 may contain phosphorus as an implant species at a dose of from $1 \times 10^{13}$ cm$^{-2}$ to $1 \times 10^{15}$ cm$^{-2}$ with an implanted energy from 100 keV to 500 keV. After the nwell implant 124, the nwell photoresist 120 may be removed and the wafer cleaned (not shown).

Figure 2D:
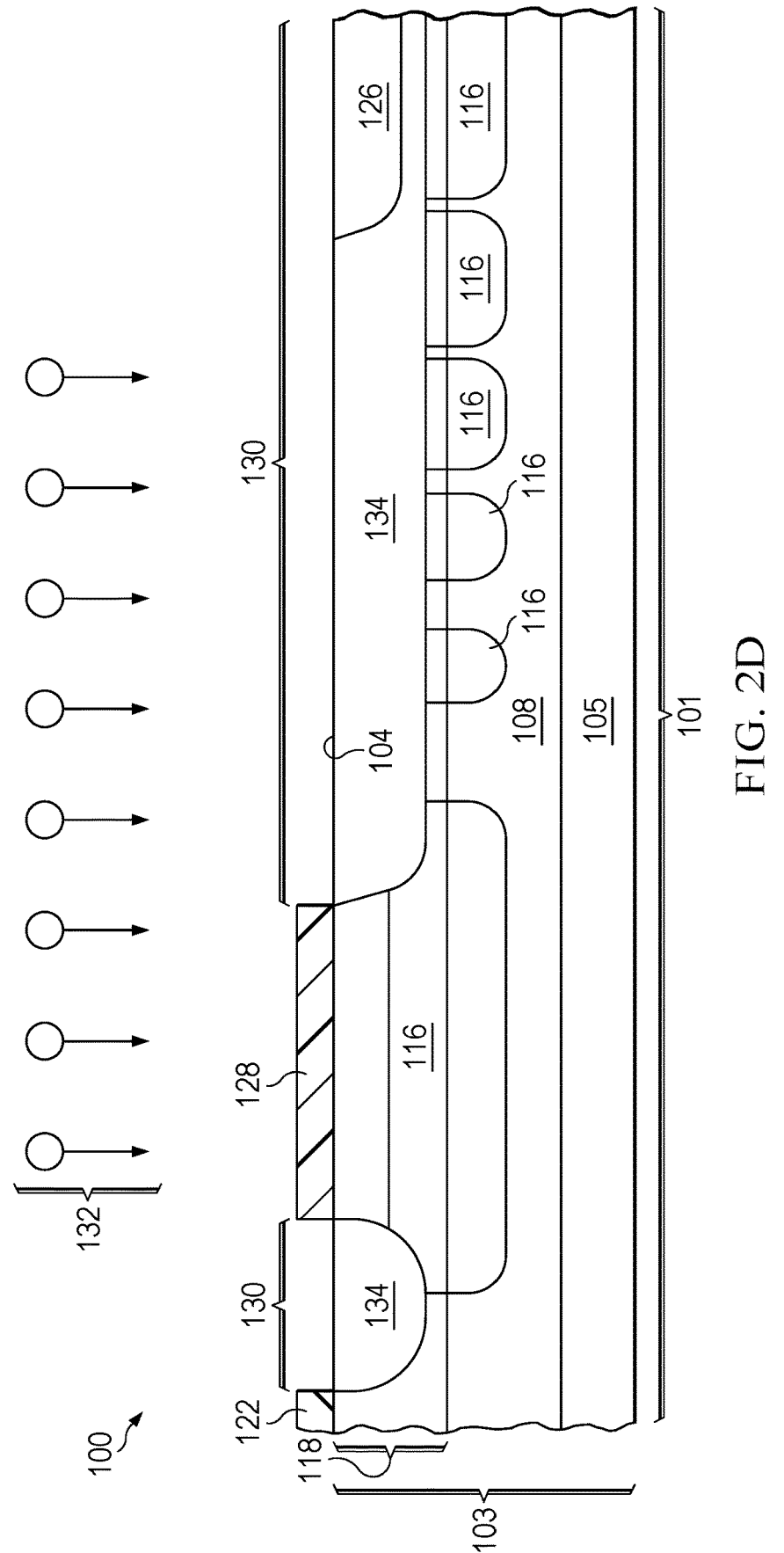

FIG. 2D shows the LDMOS transistor 101 at the point in the process flow during the formation of the high voltage nwell region 134. A high voltage nwell photoresist 128 is patterned and a a high voltage nwell resist opening 130 is formed. The high voltage nwell implant 132 may contain phosphorus as a species at a dose of from $1 \times 10^{12}$ cm$^{-2}$ to $1 \times 10^{14}$ cm$^{-2}$ with an implanted energy from 100 keV to 800 keV. After the high voltage nwell implant 132, the high voltage nwell photoresist 128 may be removed and the wafer cleaned (not shown).

Figure 2E:
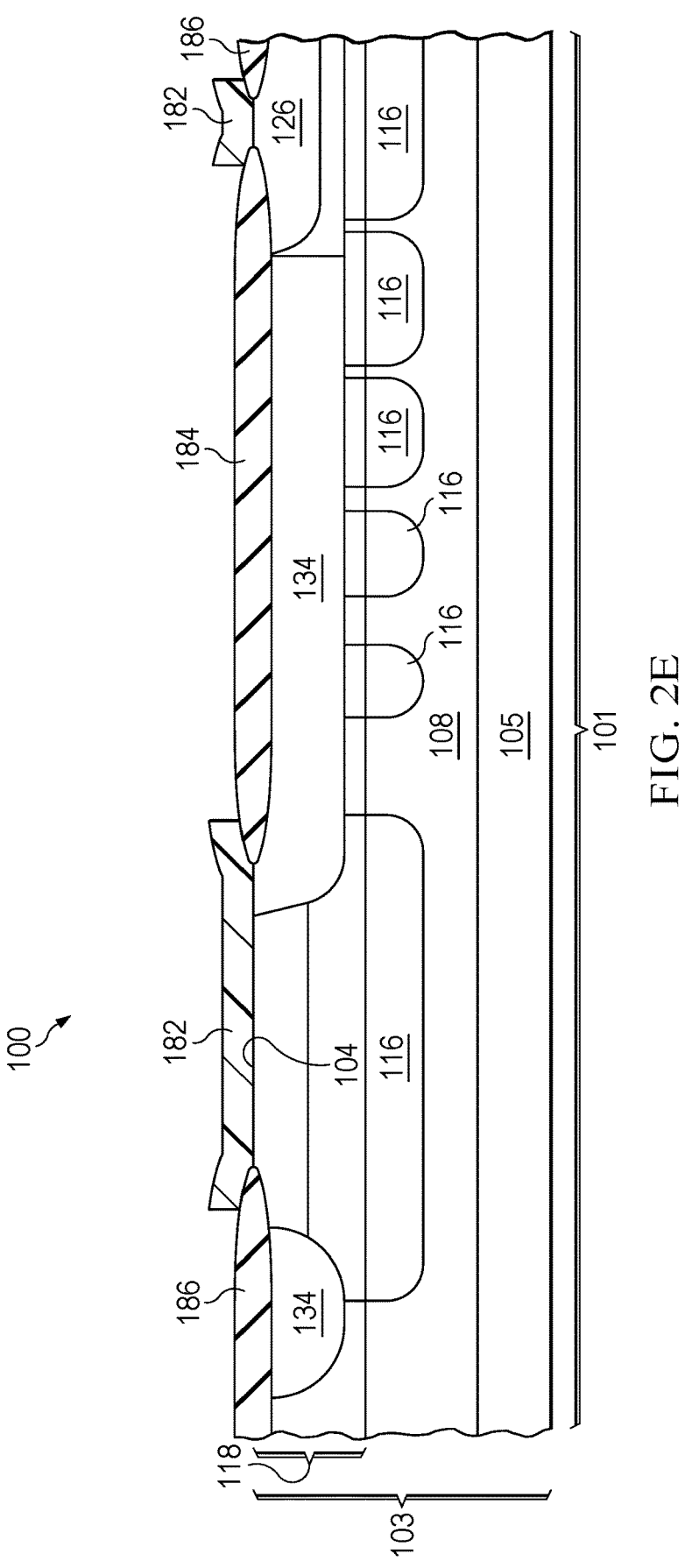

FIG. 2E shows the LDMOS transistor 101 at the point in the process flow during the formation of the field oxide 186 and field relief dielectric layer 184. A nitride deposition, a photolithographic step, and a plasma etch process (none specifically shown may be used to form a nitride mask 182 for LOCal Oxidation Of Silicon (LOCOS) formation of the field oxide 186 and field relief dielectric layer 184. Alternatively, shallow trench isolation (STI) may be utilized. After the LOCOS formation of the field oxide 186 and field relief dielectric layer 184, the nitride mask 182 is stripped from the wafer (not shown).

Figure 2F:
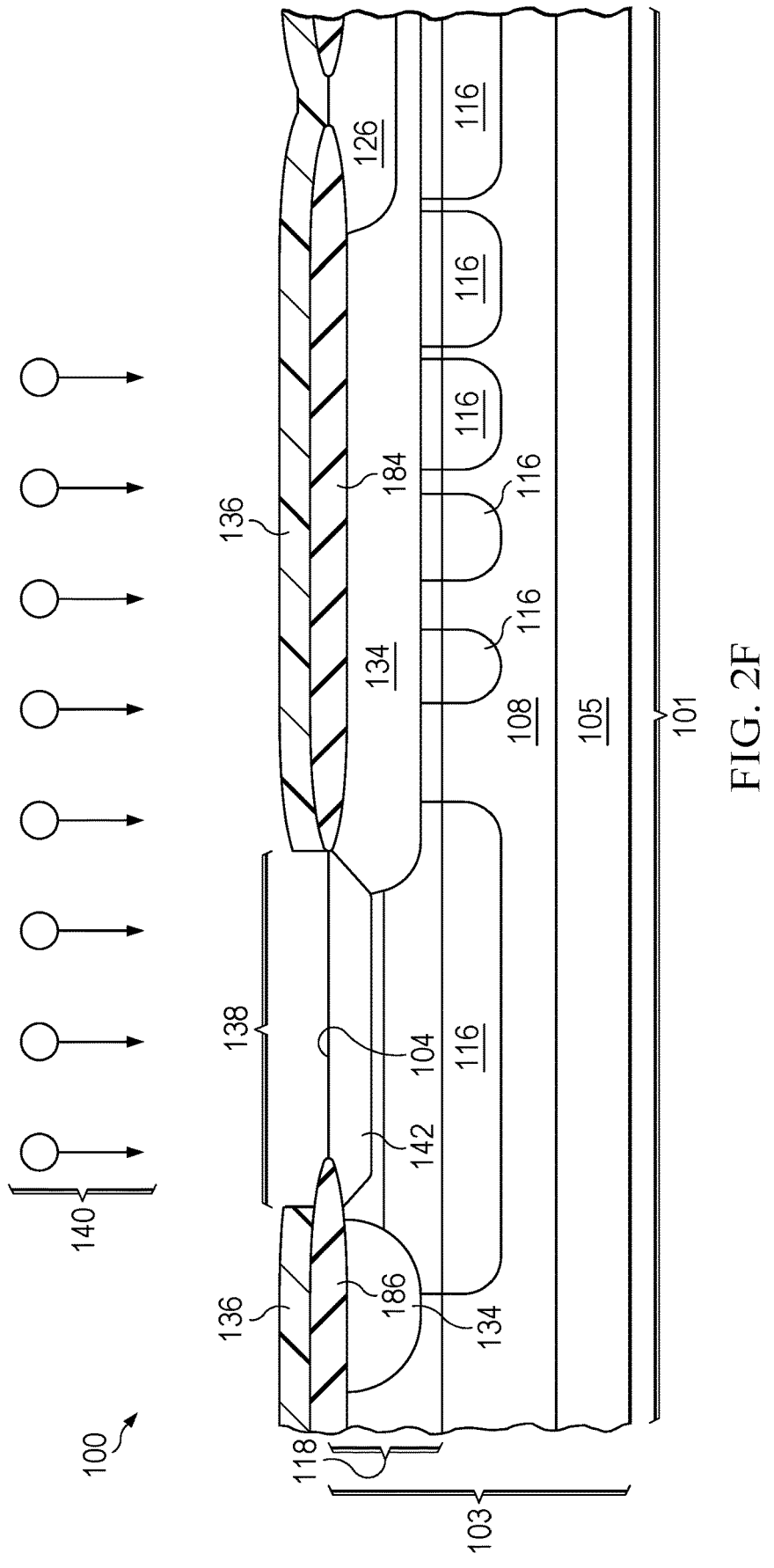

FIG. 2F shows the LDMOS transistor 101 at the point in the process flow during the formation of the p-type dwell region 142 which may also be referred to as a deep p-well. A p-type dwell photoresist 136 is patterned and a p-type dwell resist opening 138 is formed. The p-type dwell implant 140 may contain boron as an implant species. After the p-type dwell implant 140, the p-type dwell photoresist 136 may be removed and the wafer cleaned (not shown). The p-type dwell region 142 forms the body of the LDMOS transistor 101.

Figure 2G:
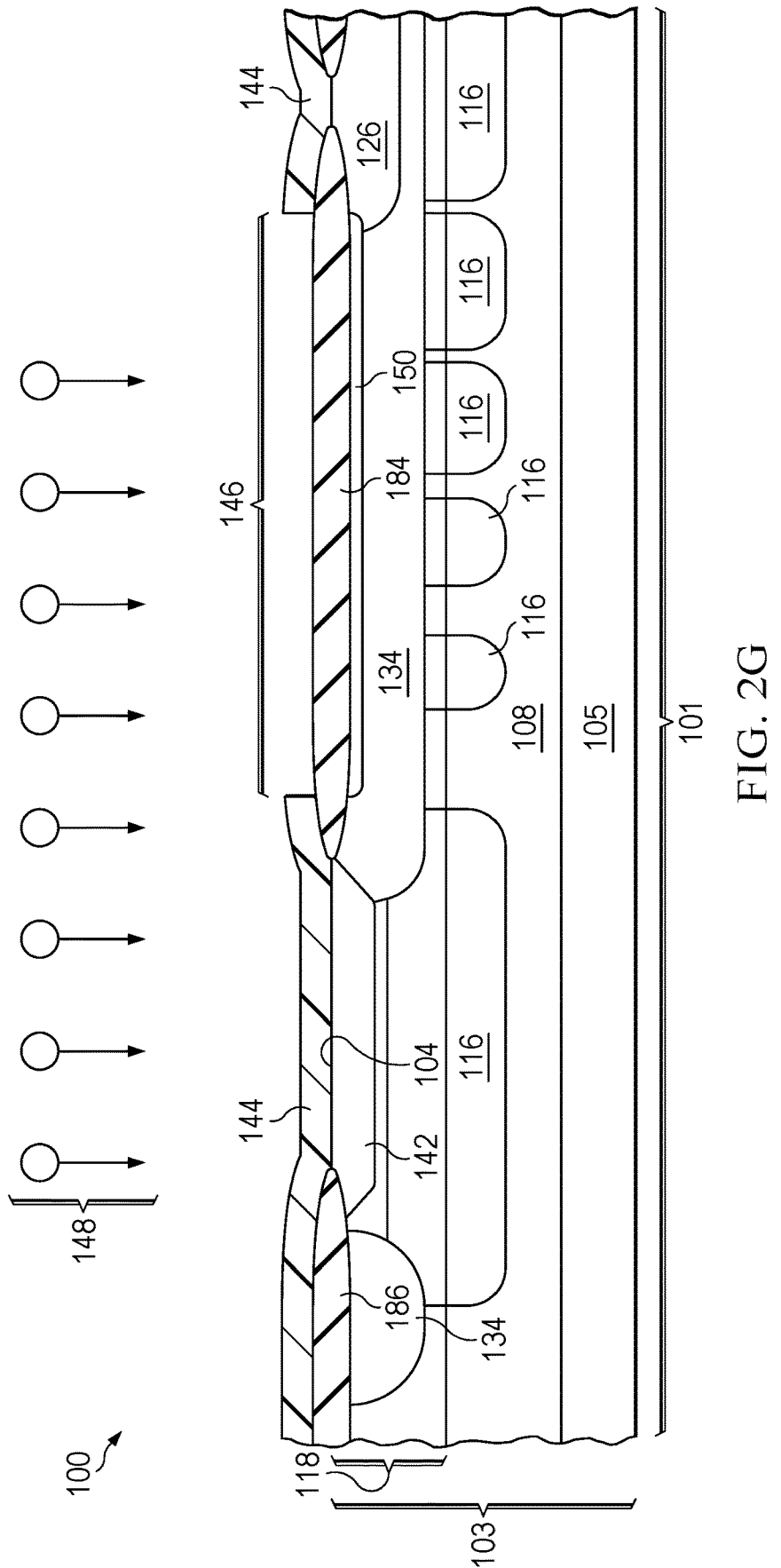

FIG. 2G shows the LDMOS transistor 101 at the point in the process flow during the formation of the charge balance layer 150. The charge balance layer 150 may also referred to as the n-channel threshold adjust for the microelectronic device 100. The charge balance layer 150 functions in the LDMOS device in much the same way as a RESURF (reduced surface field) layer. The charge balance layer 150 provides an increased depletion region which results in higher breakdown voltage of the LDMOS transistor than a conventional lateral diode and provides lower on-state resistance. A charge balance photoresist 144 is patterned and a charge balance resist opening 146 is formed. The charge balance implant 148 may contain boron as an implant species at a dose of from $1 \times 10^{12}$ cm$^{-2}$ to $1 \times 10^{13}$ cm$^{-2}$ with an implanted energy from 100 keV to 400 keV. After the charge balance implant 148, the charge balance photoresist 144 may be removed and the wafer cleaned (not shown).

Figure 2H:
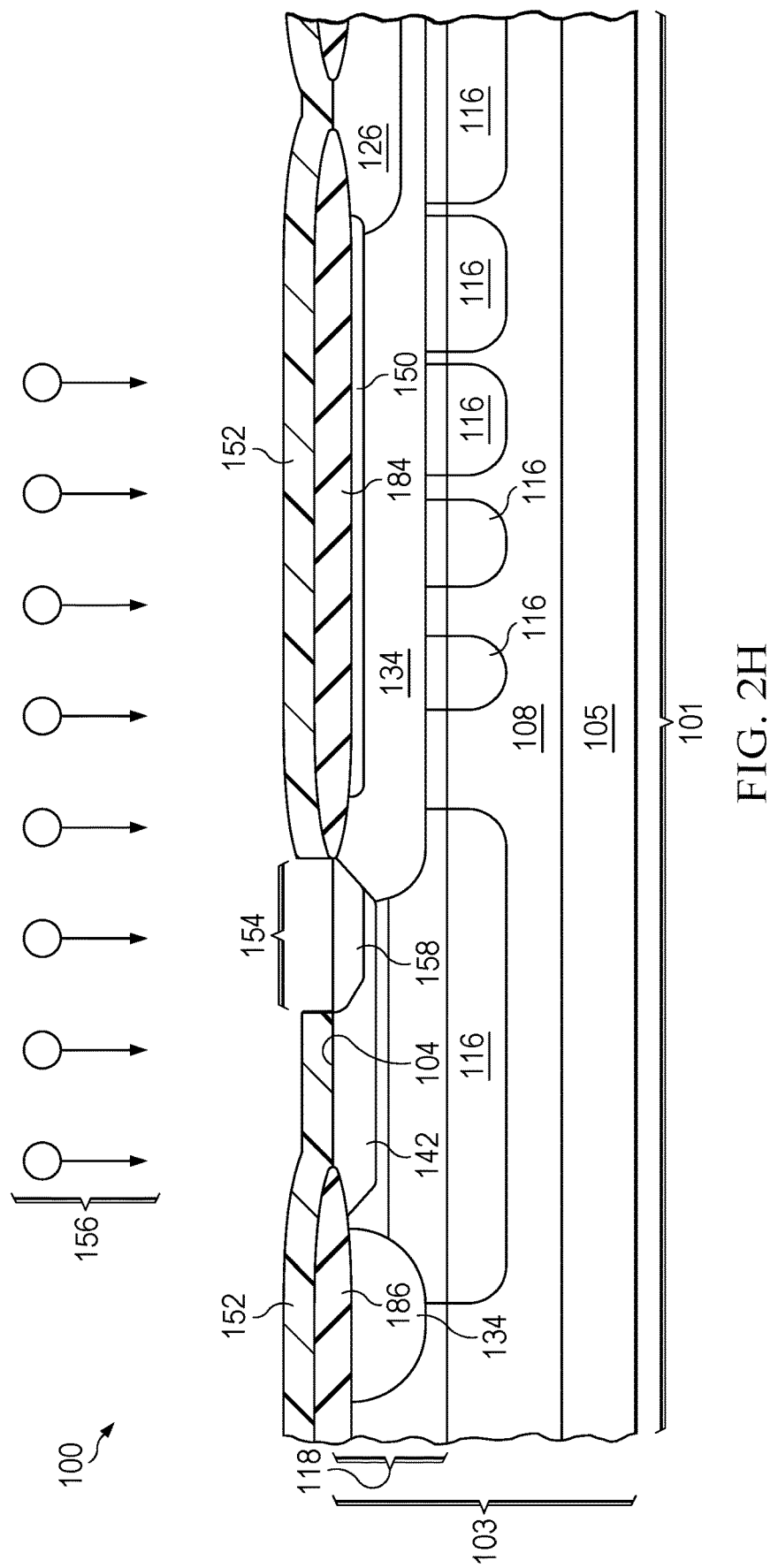

FIG. 2H shows the LDMOS transistor 101 at the point in the process flow during the formation of a p-channel threshold adjust (VTP) region 158. A VTP photoresist 152 is patterned and a VTP resist opening 154 is formed. The VTP implant 156 may contain phosphorus as an implant species at a dose of from $1 \times 10^{12}$ cm$^{-2}$ to $1 \times 10^{13}$ cm$^{-2}$ with an implanted energy from 10 keV to 300 keV. After the VTP implant 156, the VTP photoresist 152 may be removed and the wafer cleaned (not shown). The VTP region 158 provides a portion of the continuous n-type doping which results in depleted mode character of the LDMOS transistor 101

Figure 2I:
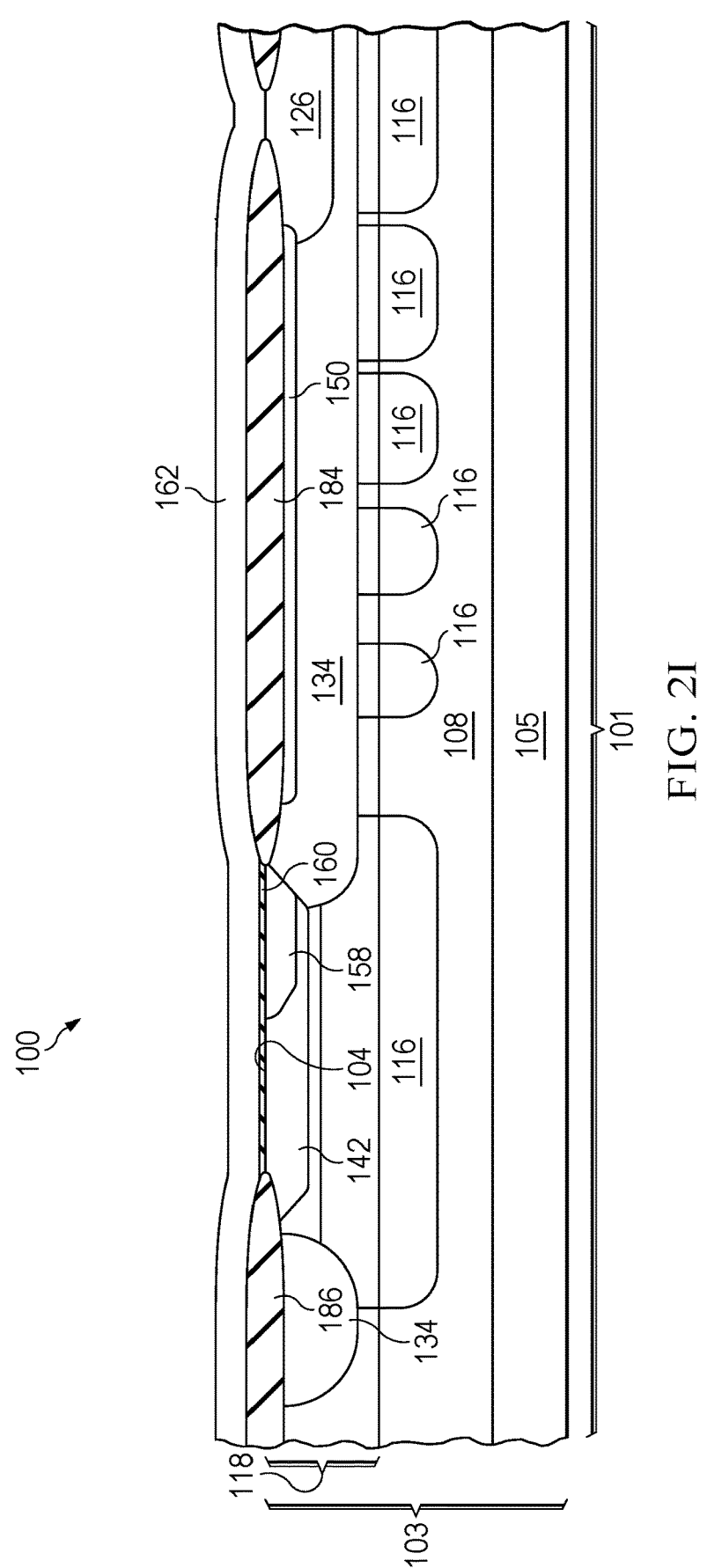

FIG. 2I shows the LDMOS transistor 101 at the point in the process flow after the formation of a gate dielectric layer 160 and a gate polysilicon layer 162. The gate dielectric layer 160 may be formed in a high temperature furnace operation or a rapid thermal process (not specifically shown). The gate dielectric layer 160 thickness can range from approximately 3 nm to 25 nm for silicon dioxide or a silicon oxynitride (SiON) gate dielectric that is slightly thinner but with a higher dielectric constant than that of silicon dioxide, which is about 3.9, by way of example. The gate dielectric layer 160 has a thickness less than the field relief dielectric layer 184 and extends over a junction between the body region and the drain drift region. After the gate dielectric layer 160 is formed, a gate polysilicon layer 162 may be deposited by a gate deposition process (not specifically shown) on the wafer using any number of silane-based precursors. Polycrystalline silicon is one example of a material for the gate polysilicon layer 162, however a metal gate or CMOS-based replacement gate electrode process can also be used to provide the gate polysilicon layer 162. The gate polysilicon layer 162 in this example is polycrystalline silicon.

Figure 2J:
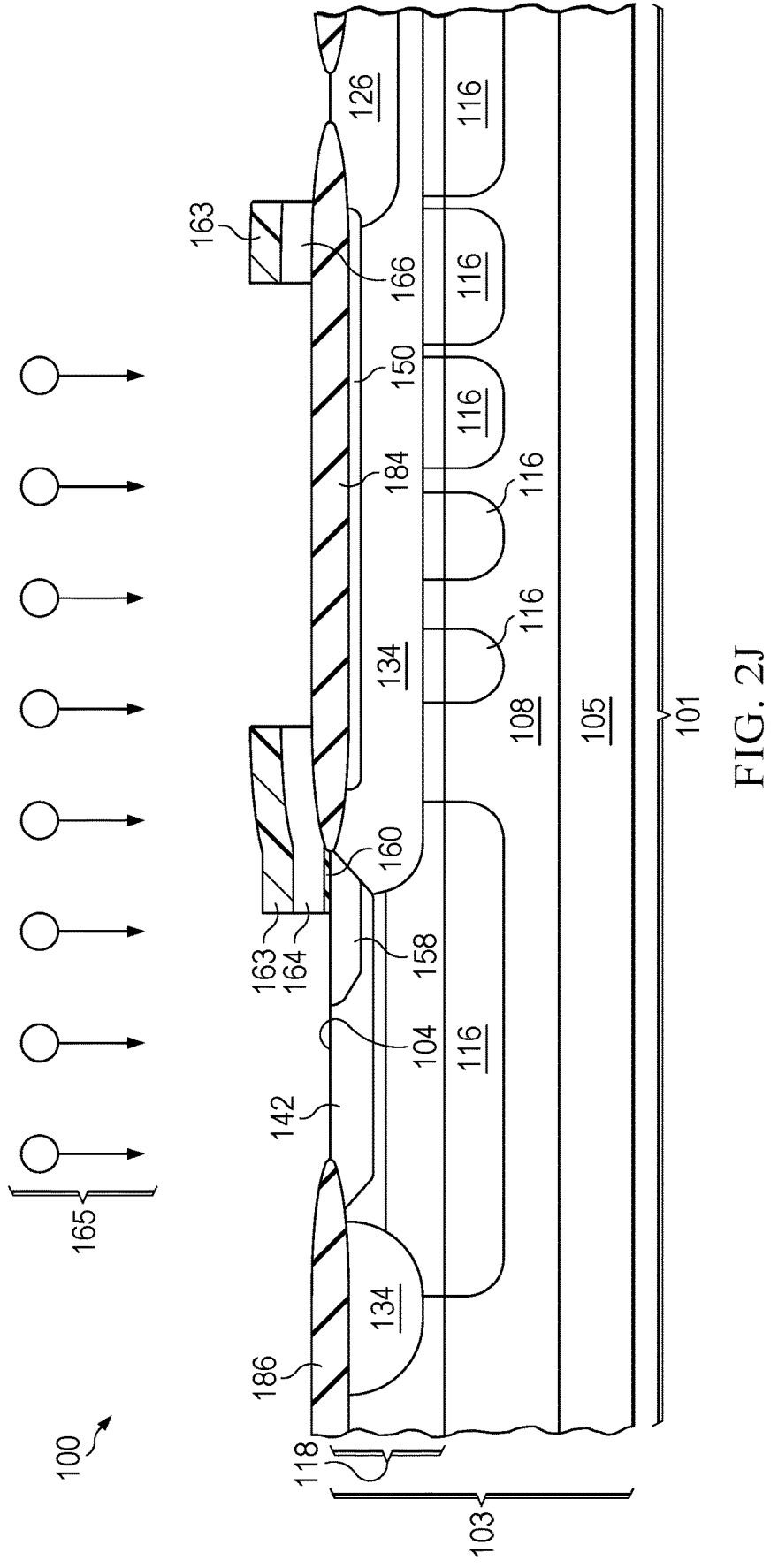

FIG. 2J shows the LDMOS transistor 101 at the point in the process flow after a gate resist 163 has been deposited and patterned and after a gate plasma etch 165 has been used to define the gate electrode 164. The gate electrode 164 may have a closed-loop configuration. After the gate plasma etch 165 is complete, the gate resist 163 is removed and a wet or dry process may be used to clean the wafer surface (not shown). A field plate 166 of polysilicon on the field relief dielectric layer 184 is also defined during the gate electrode 164 formation process.

Figure 2K:
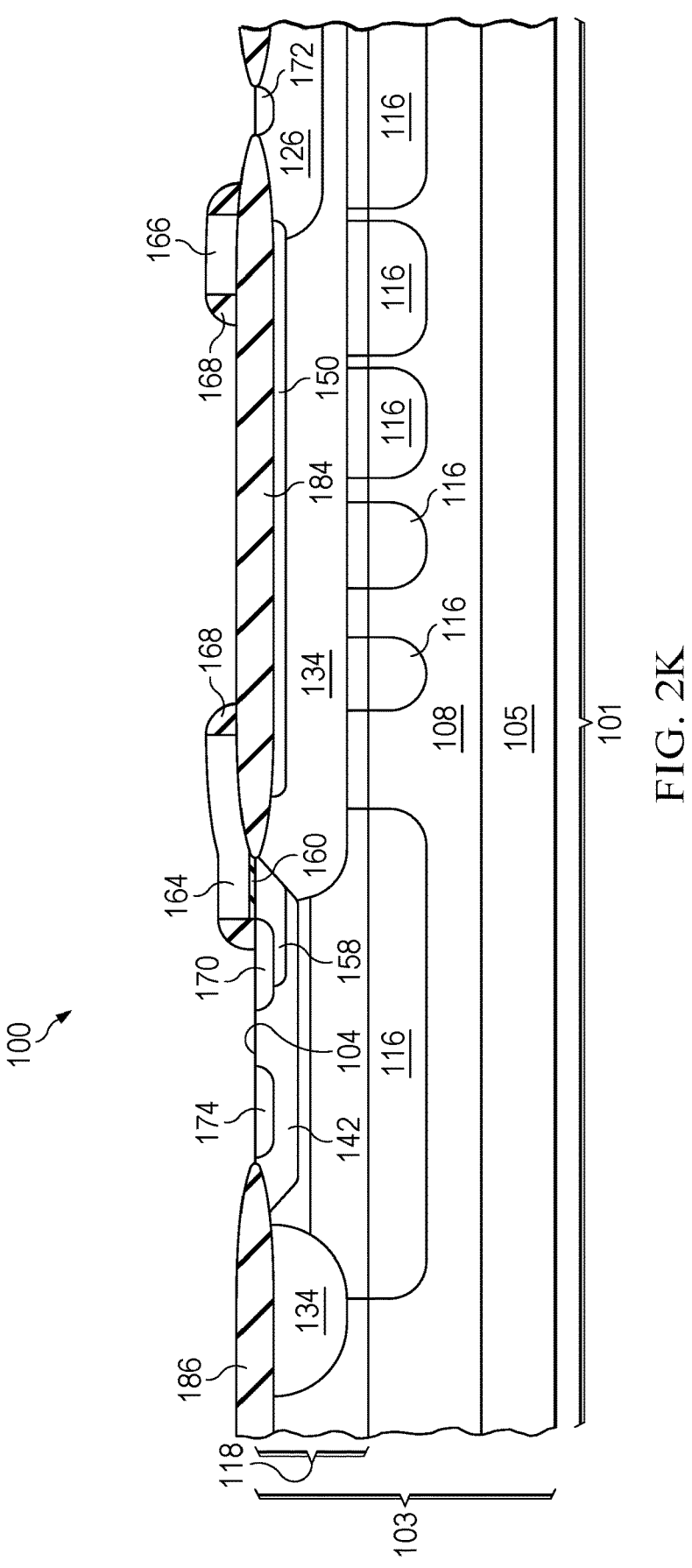

FIG. 2K shows the LDMOS transistor 101 at the point in the process flow after a sidewall 168 is formed around the gate electrode 164 and the field plate 166, the source region 170 and drain region 172 have been formed, and a PSD region 174 to the p-type dwell region 142 have been formed. The PSD region 174 may also be referred to as the body contact region. Before the source region 170, drain region 172, and PSD region 174 are formed, the sidewall is formed. The sidewall 168 is formed lateral surfaces of the gate electrode 164 and the field plate 166. The sidewall 168 may be formed by forming one or more conformal layers of a dielectric material over the top surface 104 of the substrate 103 including the gate electrode 164 and field plate 166. The dielectric material is subsequently removed from horizontal surfaces, that is, surfaces generally parallel to the top surface 104 of the substrate 103, by an anisotropic etch process such as an RIE process, leaving the dielectric material on the lateral surfaces of the gate electrode 164 and the field plate 166. The sidewall 168 may include a dielectric material such as silicon dioxide and silicon nitride. The sidewall 168 may extend 100 nanometers to 500 nanometers from the lateral edge of the gate electrode 164 and field plate 166. The source region 170 and drain region 172 are formed by source/drain ion implantation after a photolithographic pattern (neither process shown). The source/drain implant may be arsenic, and may be implanted with a done from $1 \times 10^{14}$ cm$^{-2}$ to $5 \times 10^{15}$ cm$^{-2}$ with an energy between 20 keV and 200 keV. After the implantation process, the resist is removed and the wafer cleaned. The PSD region 174 is formed by a PSD ion implantation after a photolithographic pattern (neither shown). The PSD implant species may be boron and has a dopant density at least twice the dopant density of the p-type dwell region 142.

Figure 2L:
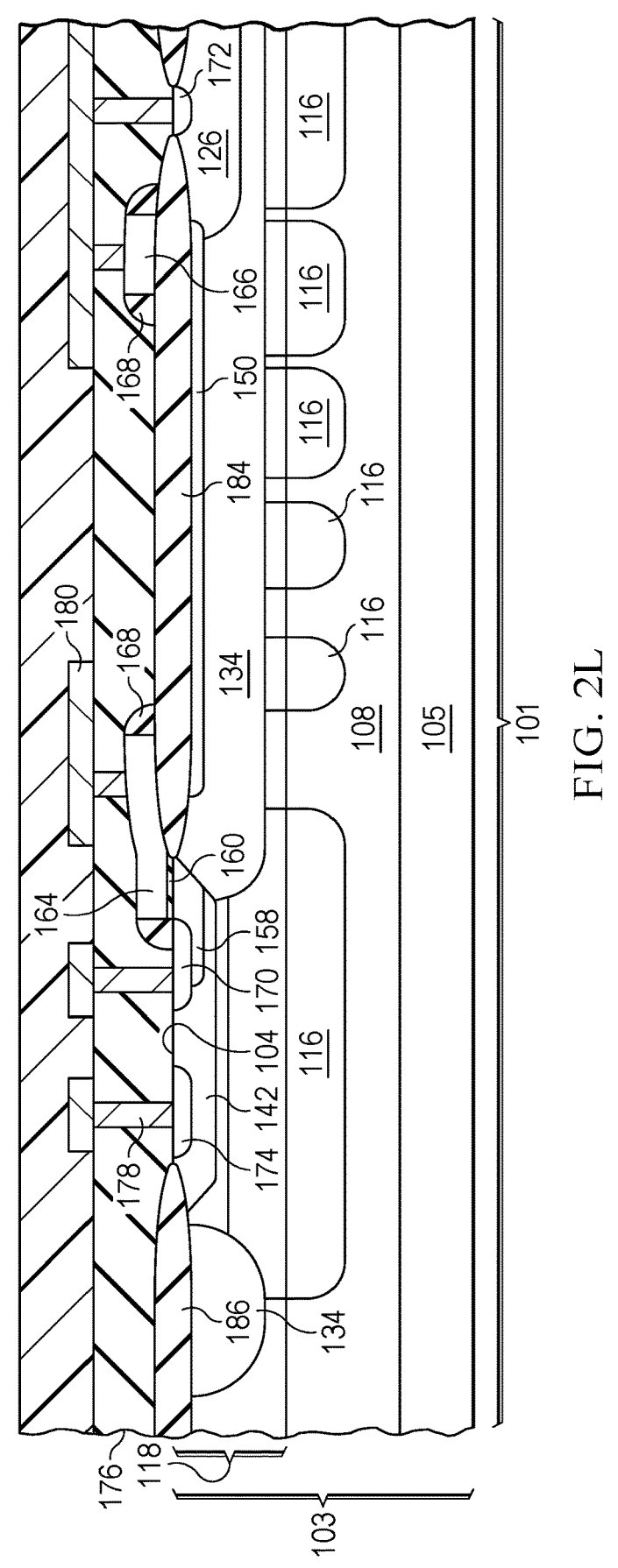

FIG. 2L shows the LDMOS transistor 101 at the point in the process flow after the first layer of interconnects have been formed. After the sidewall 168, source region 170, drain region 172, and PSD region 174 have been formed (as shown in FIG. 2K), a metal silicide layer (not specifically shown) may be formed on exposed areas of the top surface 104 of the substrate 103. A pre metal dielectric (PMD) layer 176 is formed over the top surface 104 of the substrate 103. The PMD layer 176 may include a PMD liner (not specifically shown) over the microelectronic device 100 which may be formed from a material selected from the group consisting of silicon nitride, silicon oxynitride and silicon dioxide. The main dielectric sublayer of the PMD layer 176 is formed over the PMD liner if present. The main dielectric sublayer of the PMD layer 176 may be formed by one or more dielectric deposition processes, including a PECVD process using TEOS, a high-density plasma (HDP) process, or a high aspect ratio process (HARP) using TEOS and ozone, by way of example. The PMD layer 176 may be planarized by an oxide CMP process (not specifically shown). Other methods of forming the PMD layer 176 are within the scope of this disclosure.

Contacts 178 through the PMD layer 176 may be formed. The contacts 178 may be formed by patterning and etching holes through the PMD layer 176 and the PMD liner if present to expose the metal silicide layer (not specifically shown). Contacts 178 may be filled by sputtering titanium to form a titanium adhesion layer, followed by forming a titanium nitride diffusion barrier using reactive sputtering or an ALD process. A tungsten core may then be formed by an MOCVD process using tungsten hexafluoride ($WF_6$) reduced by silane initially and hydrogen after a layer of tungsten is formed on the titanium nitride diffusion barrier. The tungsten, titanium nitride, and titanium are subsequently removed from a top surface of the PMD layer 176 by a plasma etch process, a tungsten CMP process, or a combination of both (not specifically shown), leaving the contacts 178 extending to the top surface of the PMD layer 176. The contacts 178 may be formed by a selective tungsten deposition process which fills the contacts 178 with tungsten from the bottom up, forming the contacts 178 with a uniform composition of tungsten. Other methods of forming the contacts 178 are within the scope of this disclosure.

Interconnects 180 may be formed on the contacts 178. The contacts 178 and interconnects 180 provide electrical contact between the LDMOS transistor 101 and other components of the microelectronic device 100. In versions of this example in which the interconnects 180 have an etched aluminum structure, the interconnects 180 may be formed by depositing an adhesion layer, an aluminum layer, and an anti-reflection layer, and forming an etch mask (not explicitly shown) followed by an RIE process to etch the anti-reflection layer, the aluminum layer, and the adhesion layer where exposed by the etch mask, and subsequently removing the etch mask.

In versions of this example in which the interconnects 180 have a damascene structure, the interconnects 180 may be formed by forming an inter-metal dielectric (IMD) layer (not specifically shown) on the PMD layer 176, and etching interconnect trenches through the IMD layer to expose the contacts 178. A barrier liner (not specifically shown) may be formed by sputtering tantalum onto the IMD layer and the PMD layer 176 which is exposed and contacts 178, and forming tantalum nitride on the sputtered tantalum by an ALD process. A copper fill metal may be formed by sputtering a seed layer (not explicitly shown) of copper on the barrier liner, and electroplating copper on the seed layer to fill the interconnect trenches. The copper and barrier liner metal are subsequently removed from a top surface of the IMD layer by a copper CMP process (not specifically shown).

Figure 3A:
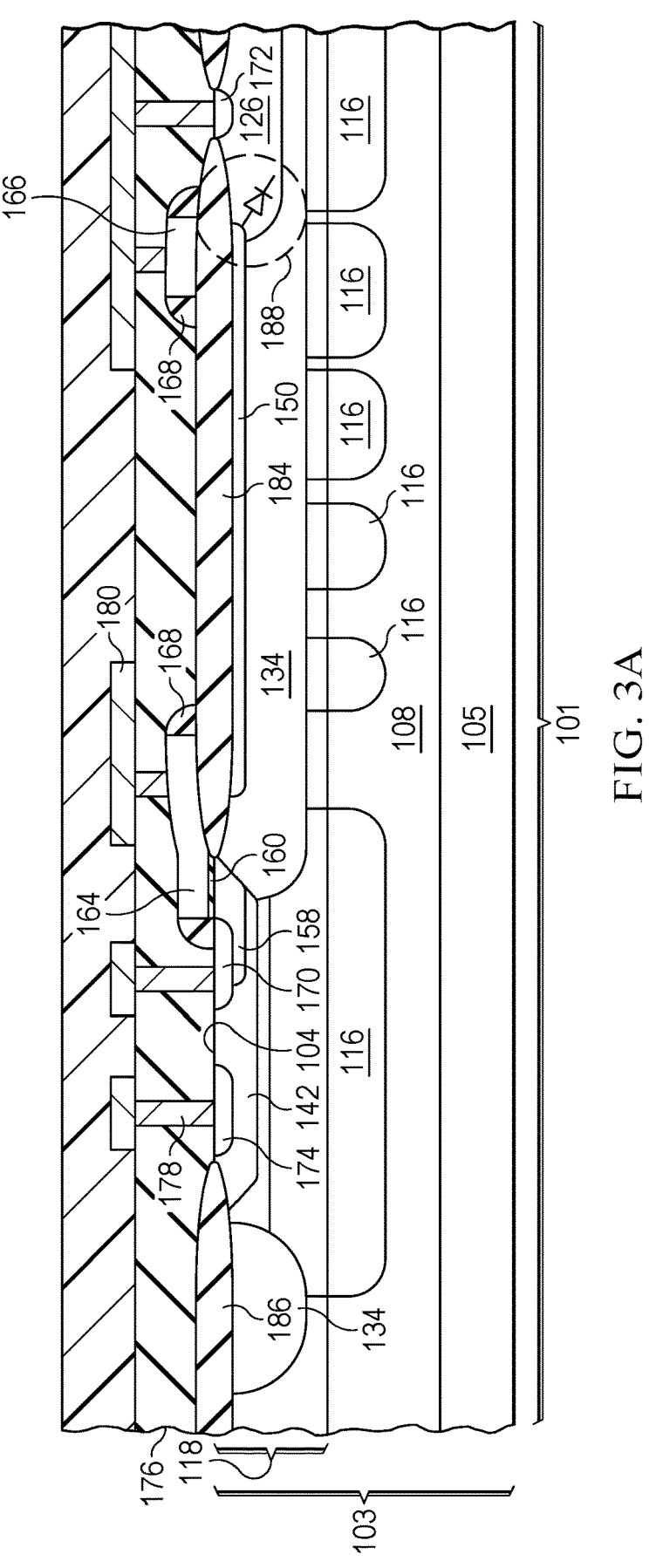
FIG. 3A is a cross section of an example LDMOS transistor showing a region where body diode turn-on may occur when the charge balance layer is connected to the body region.

Referring to FIG. 3A, it is advantageous to ground the charge balance layer 150 to eliminate body diode turn-on 188 of the LDMOS transistor 101 at voltages greater than approximately 0.7 volts. The region of body diode turn-on 188 occurs when the charge balance layer 150 is locally connected to the body (i.e. locally connected to the source region 170), of the LDMOS transistor 101. In this disclosure, the charge balance layer 150 is grounded to the epitaxial layer 118 ground reference outside the LDMOS transistor 101 as show in FIG. 2A and FIG. 2C. Other means of grounding the charge balance layer 150 are within the scope of the disclosure. Grounding the charge balance layer 150 eliminates the body diode turn on 188 mechanism and allows source voltage to increase from approximately 0.7 volts to up to six volts where parasitic PNP turn on limits the source voltage.

Figure 3B:
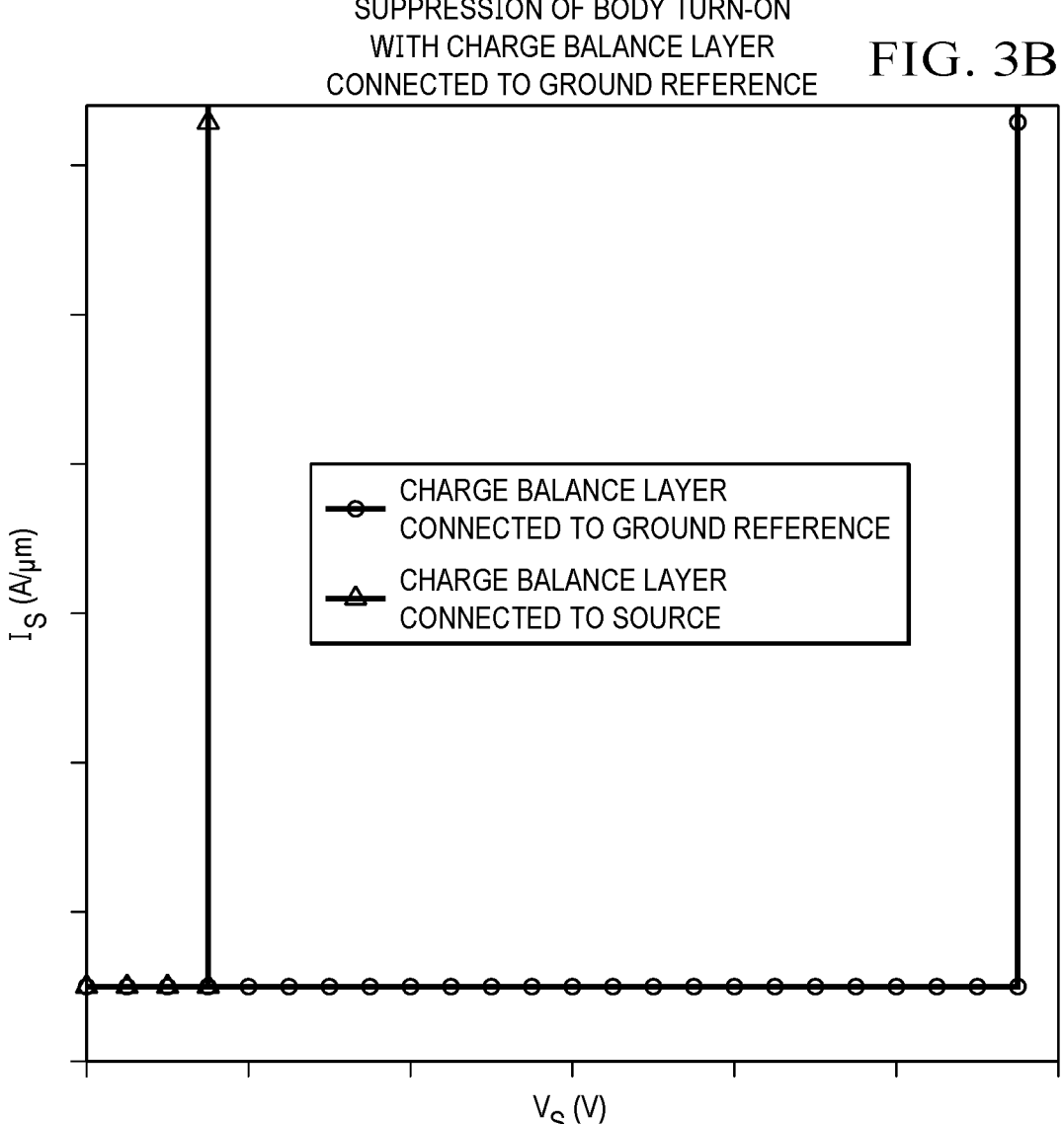
FIG. 3B is a graph of the suppression of transistor body turn-on when an example LDMOS transistor charge balance layer is electrically connected to a ground reference.

FIG. 3B, shows a graphical representation comparing source voltage when the charge balance layer 150 locally connected to the source region 170 and is subject to body diode turn-on 188 and when the charge balance layer 150 is connected to a ground reference as shown in FIG. 2A. The body diode turn-on 188 occurs at a source voltage of about 0.7 volts when the charge balance layer 150 is locally connected to the source region 170, while the source voltage may be increased to about 6 volts when the charge balance layer 150 is isolated from the source region 170 and grounded to the epitaxial layer 118 ground reference. Beyond 6 volts, parasitic PNP turn-on becomes a factor.

Figure 4A:
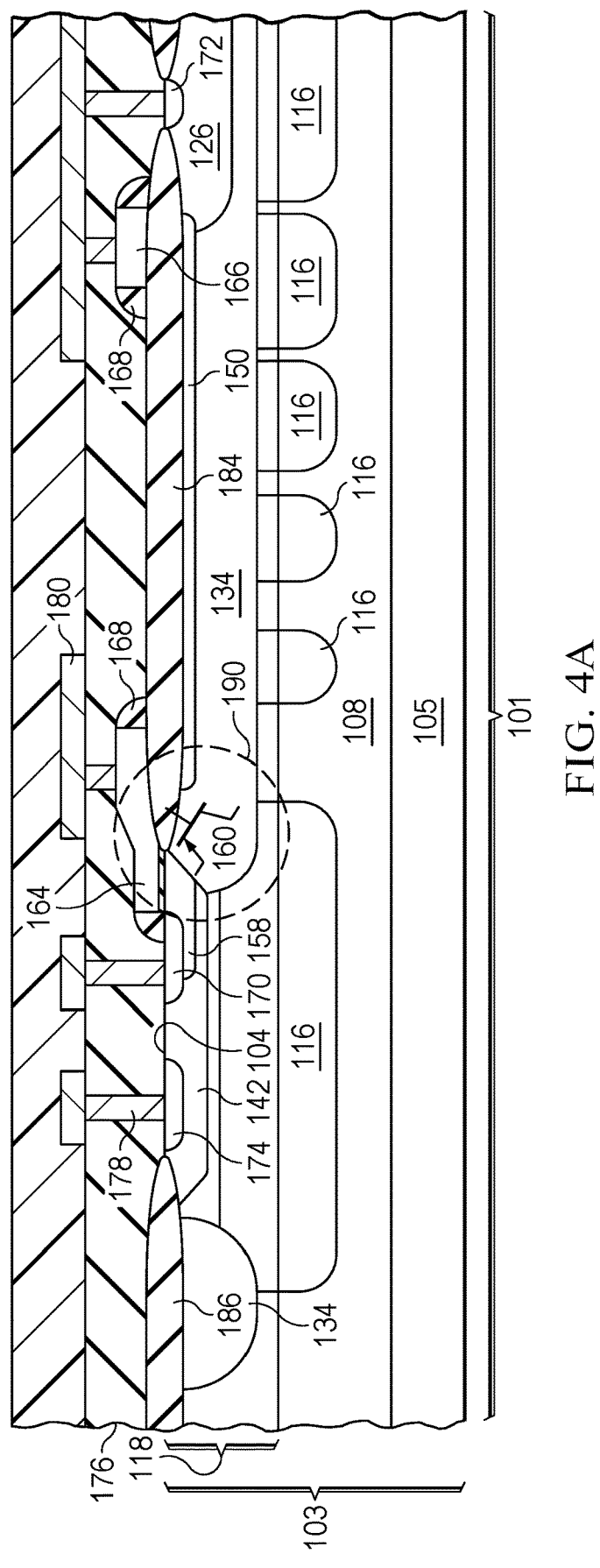
FIG. 4A is a cross section of an example LDMOS transistor showing a region where PNP parasitic turn-on may occur.

Referring to FIG. 4A, PNP turn-on 190 limits the source voltage of the LDMOS transistor 101 to approximately 6 volts when the charge balance layer 150 is grounded and the PSD region 174 is in parallel with the source region 170 through the interconnects 180 (not specifically shown). As shown in FIG. 4A, is advantageous to eliminate the metal connection between source region 170 and PSD region 174 and for the source region 170 to be spaced with respect to the PSD region 174 by a space of greater than 0.5 um, to allow the PSD region 174 and p-type dwell region 142 of the LDMOS transistor 101 to be to be a negatively biased to be with respect to the source region 170. The negative bias on the p-type dwell region 142 with respect to the source region 170 allows the source voltage to be increased to approximately 30 V when a negative 5 volt bias is applied to the PSD region 174.

Figure 4B:
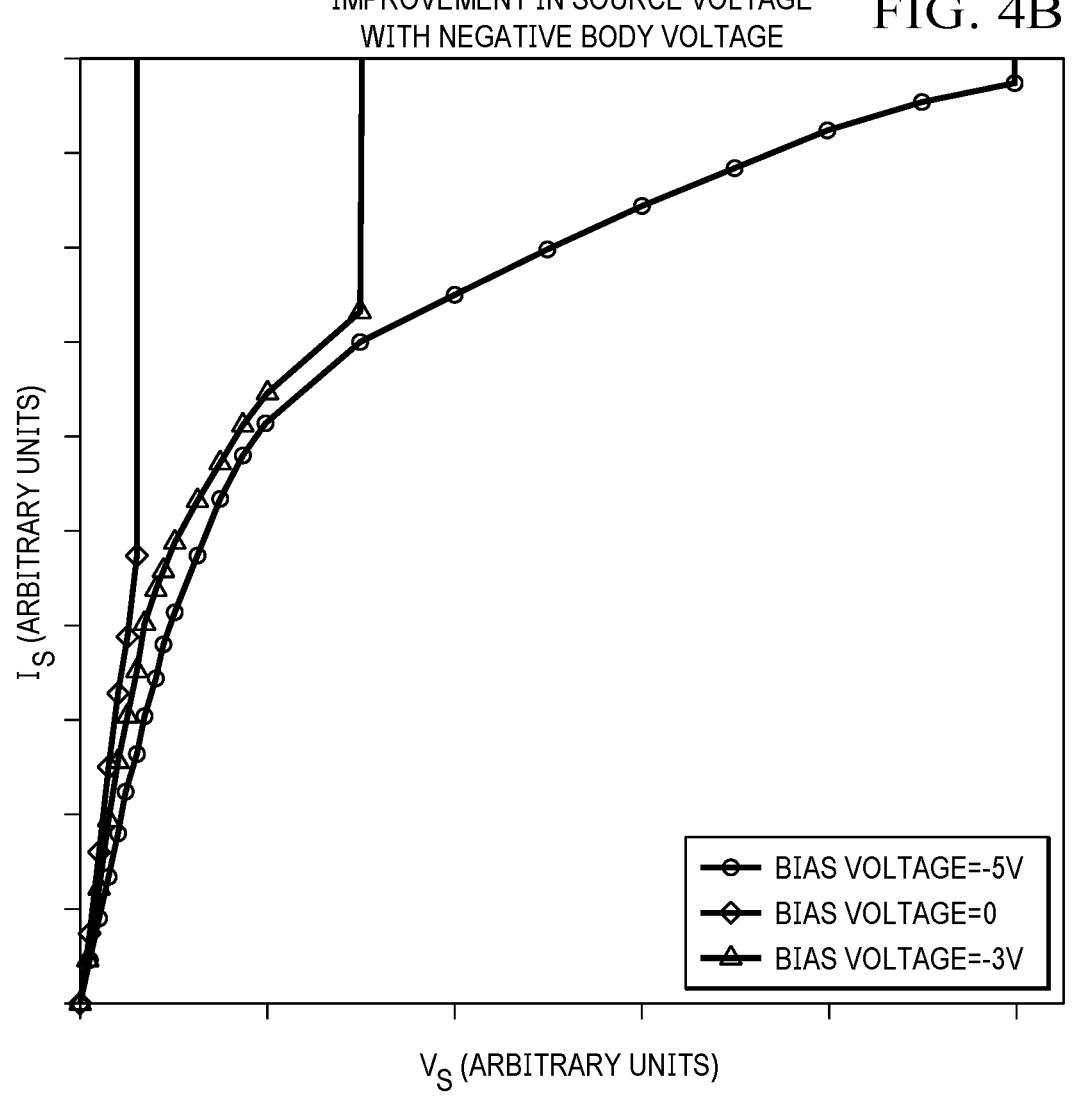
FIG. 4B is a graph showing improved source voltage with increased negative voltage applied to the body region for an example LDMOS transistor.

Referring to FIG. 4B, a graph shows the effect of several bias conditions on the parasitic PNP turn on 190 when the PSD region 174 and source region 170 are separated as discussed in FIG. 4A. When the negative bias applied to the p-type dwell region 142 is 0 Volts, the parasitic PNP turn on 190 is approximately 6 volts. When the negative bias applied to the p-type dwell region 142 is –1 Volt, the parasitic PNP turn on 190 is approximately 10 volts. When the negative bias applied to the p-type dwell region 142 is –30 Volts, the parasitic PNP turn on 190 is approximately 30 volts.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A microelectronic device, comprising:
a semiconductor material of a substrate, the semiconductor material including a body region having a first conductivity type and a drain drift region having a second conductivity type;
a charge balance layer over the drain drift region, the charge balance layer being electrically isolated from the body region and being electrically in contact with the substrate;
a field relief dielectric layer over the drain drift region, the field relief dielectric layer extending from a gate dielectric layer toward a drain region and having a thickness greater than the gate dielectric layer, the gate dielectric layer extending over a junction between the body region and the drain drift region;
a gate electrode over the gate dielectric layer;
a source region having the second conductivity type;
the drain region having the second conductivity type contacting the drain drift region, the drain region having a dopant density at least twice the drain drift region; and
a body contact region having the first conductivity type in direct contact with the body region, the body contact region having a dopant density at least twice the body region.

2. The microelectronic device of claim 1, wherein the body contact region is separated from the source region.

3. The microelectronic device of claim 1, wherein the charge balance layer is of the first conductivity type.

4. The microelectronic device of claim 1, wherein the body contact region has a separate electrical connection from an electrical connection of the source region.

5. The microelectronic device of claim 1, wherein a threshold voltage region of the second conductivity type is contacting the source region and the drain drift region.

6. The microelectronic device of claim 1, wherein the field relief dielectric layer includes a local oxidation of silicon (LOCOS) layer of dielectric material.

7. The microelectronic device of claim 1, wherein the first conductivity type is p-type and the second conductivity type is n-type.

8. The microelectronic device of claim 1, wherein the body region, the drain drift region, the charge balance layer, and the gate electrode are elements of a depleted mode laterally diffused metal oxide semiconductor (LDMOS) transistor that is a portion of a high voltage isolation circuit of the microelectronic device.

9. The microelectronic device of claim 1, wherein a charge balance layer connection is located between the source region and a junction diode of a high voltage isolation circuit.

10. The microelectronic device of claim 1, wherein charge balance layer connections to the substrate are located between a plurality of segments of the source region of a high voltage isolation circuit.

* * * * *